United States Patent
Mori et al.

[11] Patent Number: 6,028,784
[45] Date of Patent: Feb. 22, 2000

[54] FERROELECTRIC MEMORY DEVICE HAVING COMPACT MEMORY CELL ARRAY

[75] Inventors: Kazuya Mori, Dallas; Toshiyuki Nagata, Plano, both of Tex.

[73] Assignee: Texas Instruments Incorporated, Dallas, Tex.

[21] Appl. No.: 09/300,931

[22] Filed: Apr. 28, 1999

Related U.S. Application Data

[60] Provisional application No. 60/083,896, May 1, 1998.

[51] Int. Cl.[7] ........................................ G11C 7/00
[52] U.S. Cl. ............................. 365/145; 365/63
[58] Field of Search ................... 365/145, 149, 365/63, 51

[56] References Cited

U.S. PATENT DOCUMENTS

| | | | |
|---|---|---|---|
| 5,414,654 | 5/1995 | Kubota et al. | 365/145 |
| 5,430,671 | 7/1995 | Hirano et al. | 365/145 |

*Primary Examiner*—Vu A. Le
*Attorney, Agent, or Firm*—Robby T. Holland; Carlton H. Hoel; Richard L. Donaldson

[57] ABSTRACT

A ferroelectric random access memory (FeRAM) is disclosed. The FeRAM (400) provides a folded bit line array having memory cells (402a–402f and 404a–404d) with an area equivalent to $6F^2$, where F is a minimum feature size. Reduced array size is achieved by utilizing access transistors of complementary conductivity type within the array. First type memory cells (402a–402f) having n-channel access transistors (N400a–N400f), are formed next to second type memory cells (404a–404d) having p-channel access transistors (P400a–P400d). Bit lines (410a–410e) are arranged into bit line pairs, with a first bit line of each pair being coupled to first type memory cells (402a–402f) and the second bit line of each bit line pair being coupled to second type memory cells (404a–404d). When a word line is driven to a first voltage, ferroelectric capacitor data is driven on the first bit line, while the second bit line provides a reference voltage. When a word line is driven to a second voltage, ferroelectric capacitor data is driven on the second bit line and the first bit line provides a reference voltage.

49 Claims, 7 Drawing Sheets

FERROELECTRIC MEMORY DEVICE HAVING COMPACT MEMORY CELL ARRAY

This application claims priority under 35 USC §119(e)(1) of provisional application No. 60/083,896 filed May 1, 1998.

TECHNICAL FIELD

The present invention relates generally to semiconductor memory devices, and more articularly to ferroelectric memory devices, including the arrangement of memory cell arrays for such memory devices.

BACKGROUND OF THE INVENTION

Semiconductor memory devices continue to play important roles in computing systems, as both standalone components, or as memory arrays "embedded" into a larger integrated circuit. The basic functions of memory devices are well-known; data is read from or written into the device (or the device is programmed) by the application of an address, in conjunction with various control signals. In order to accommodate faster system speeds, it is desirable to make memory devices with as fast an operating speed as possible. At the same time, it is also desirable to make semiconductor memory devices as small as possible. Smaller memory devices can be typically manufactured on a more cost effective basis.

Advances in manufacturing allow generational "shrinks" in memory device features, and thus allow the production of devices having smaller overall sizes. However, such approaches utilize existing memory device layout approaches, and so only provide incremental reductions in device sizes.

Another important feature of a memory device is whether the memory device is volatile or nonvolatile. Volatile memory devices are generally preferred for their faster operating speeds. Reading information from, and writing information to, requires only a very small amount of time. The disadvantage of volatile memory devices is that once power is removed from the device, the information stored within is lost. In contrast, nonvolatile memory devices can retain data in the absence of power. A common drawback to most nonvolatile memory devices is their relatively slow access speeds. In addition, some nonvolatile memory devices, such as electrically erasable programmable read only memories (EEPROMs), require a programming operation in order to initially store data within the memory devices. Such programming operations can be complex, and require relatively long periods of time, and consume large amounts of power.

One type of memory device which provides both nonvolatile storage and relatively rapid operating speeds, is the ferroelectric random access memory (FeRAM or FRAM). A FeRAM typically utilizes capacitor structures having a dielectric formed from a ferroelectric material. Ferroelectric capacitors exhibit a hysteresis (or inelastic) response to an applied electric field. That is, in a standard (i.e., non-ferroelectric capacitor) when an electric field is applied, positive charge is displaced toward one plate of the capacitor, while negative charge is displaced toward an opposite plate. The displacement of charge is often referred to as polarization. Once the electric field is returned to zero, the charges return to their original distribution. Unlike conventional capacitors, in ferroelectric capacitors, a certain amount of charge displaced by an initial electric field, will remain displaced, and not return to a nonpolarized state once the field is removed. An opposite field will then be required to place the ferroelectric capacitor back into the non-polarized state.

A common FeRAM cell, is the one-transistor, one capacitor memory cell. Such memory cells provide for a compact cell size. Within a FeRAM memory device, the FeRAM cells are arranged into an array of rows and columns. The memory cells within an array are accessed by word lines, bit lines, and plate lines within the array. The manner in which memory cells are coupled to their respective word lines, bit lines and plate lines (the array "architecture") can affect the performance and overall resulting size of a FeRAM. Thus, array architecture can have a considerable impact in determining overall memory device size.

U.S. Pat. No. 5,541,872 sets forth a FeRAM that utilizes one-transistor, one-capacitor memory cells. The FeRAM array and associated sense amplifiers are reproduced in a schematic diagram in FIG. 1. The prior art FeRAM is designated by the general reference character 100 and is shown to include a number of memory cells, shown as 102a–102e. Each memory cell 102a–102e includes an n-channel pass transistor N100a–N100e and an associated ferroelectric capacitor C100a–C100e. Each ferroelectric capacitor is connected by a first plate to the pass transistor of its associated memory cell.

Figure 1:
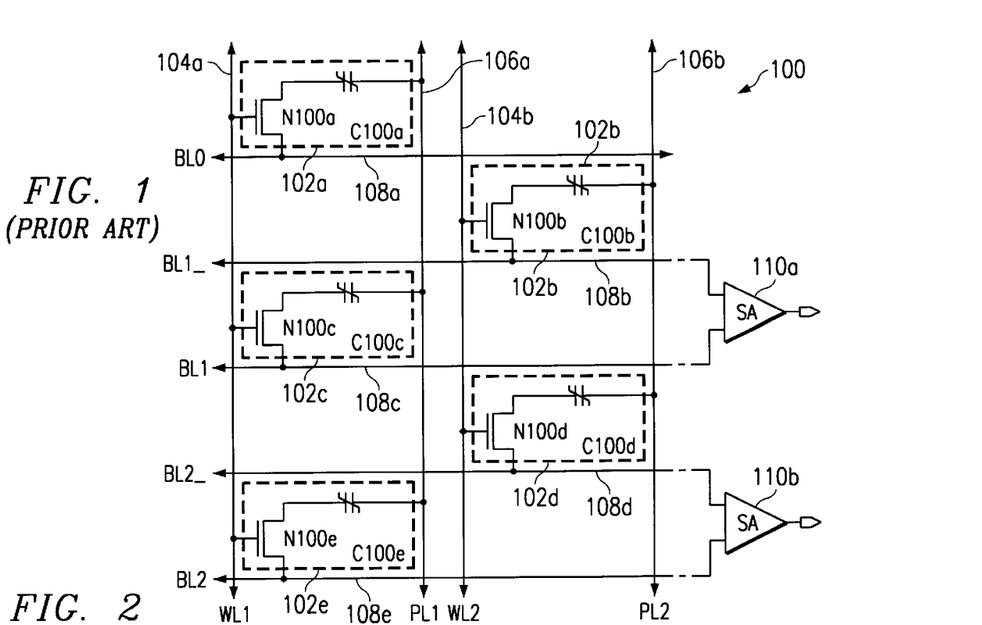
FIG. 1 is a schematic diagram of a prior art ferroelectric memory device having a folded bit line architecture.

Memory cells 102a, 102c and 102e are within a first row, and have the gates of their respective access transistors (N100a, N100c and N100e) coupled to a first word line 104a (WL1). The second plates of the ferroelectric capacitors within the row (C100a, C100c and C100e) are coupled to a first plate line 106a. Memory cells 102b and 102d are in a second row, and are coupled to a second word line 104b (WL2). The second plate of ferroelectric capacitors C100b and C100d are coupled to a second plate line 106b. The memory cells (102a–102e) are each coupled to a given bit line (108a–108e) at the sources of their respective pass transistors (N100a–N100e).

The prior art FeRAM of FIG. 1 sets forth a "folded" bit line architecture. In a folded bit line architecture, the activation of a word line results in memory cell data being coupled to alternating bit lines. For example, in FIG. 1, when word line 104a is activated (goes high), memory cells 102a, 102c and 102e are coupled to bit lines 108a, 108c and 108e (which can be considered odd bit lines). The remaining bit lines 108b and 108d (which can be considered even bit lines) are equalized to a reference voltage. Pairs of adjacent bit lines, each consisting of an even bit line and an odd bit line, are coupled to a sense amplifier. Thus, as shown in FIG. 1, bit lines 108b and 108c are coupled to a sense amplifier 110a, while bit lines 108d and 108e are coupled to sense amplifier 110b. Folded bit line architectures provide the advantage of increased noise resistance, as the arrangement of the bit line pairs results in greater rejection of common mode noise.

Figure 2:
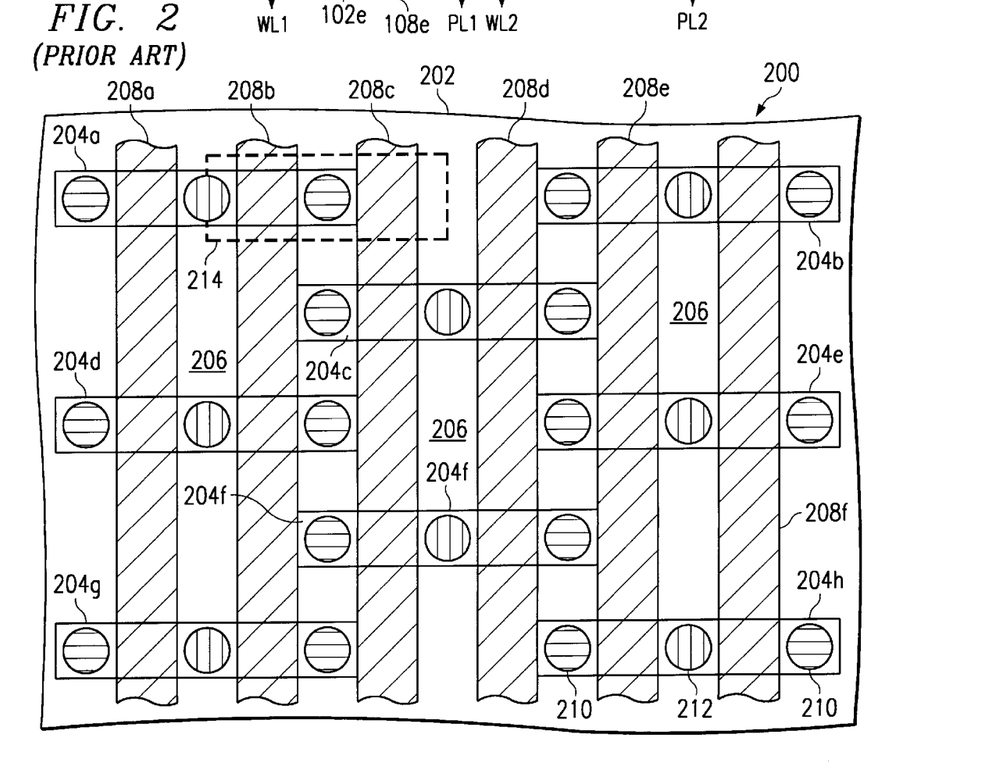
FIG. 2 is top plan view of a prior art folded bit line ferroelectric memory device array.

A drawback to prior art folded bit line architectures is the amount of area required for the memory cells of the array. Referring now to FIG. 2, a top plan view of a folded bit line FeRAM array, such as that of FIG. 1, is set forth. The FeRAM array is designated by the general reference character 200 and is shown to be formed on a semiconductor substrate 202 having a number of active areas (204a–204h) formed therein. The active areas (204a–204h) are separated from one another by isolation structures 206.

A number of word lines 208a–208f are formed over the active areas (204a–204h). The active areas (204a–204h) can be considered to be grouped into even columns and odd columns. In the folded bit line arrangement of FIG. 2, consecutive word line pairs cross over the active areas of odd columns or even columns. For example, word line pair 208a/208b crosses over active areas 204a, 204d and 204g, which can be considered to be in even columns. Word line pair 208c/208d crosses over active areas 204c and 204f, which can be considered to be in odd columns. Coupled to each active area are two storage node contacts and one bit line contact. The storage node contacts for active area 204h are shown as items 210, and the bit line contact is shown as item 212. The storage node contacts and bit line contacts for the other active areas (204a–204g) are illustrated in FIG. 2, but not given a reference character.

It is understood that bit line contacts are coupled to bit lines (not shown in FIG. 2) which would be disposed in the column direction. Each storage node contact is coupled to one plate of a ferroelectric capacitor (also not shown in FIG. 2).

The areas occupied by the memory cells of the array 200 are shown in FIG. 2 by area indication 214. If the minimum manufacturable feature size (for example the width of a word line) is given as "F," the memory cells are shown to occupy an area equal to $8F^2$. While generational shrinks in such folded bit line architectures can result in smaller memory device sizes, it would be desirable to find some way of further reducing the size of the FeRAM device.

Smaller FeRAM memory cell areas are possible, but can suffer in performance. For example "open" bit line architectures can memory cells having areas that are smaller than those of folded bit line architectures, but will suffer more from the effects of noise. An open bit line array arrangement is set forth in FIG. 3. The open bit line array is designated by the general reference character 300, and includes a number of active areas 302a–302j formed in a semiconductor substrate 304. The active areas 302a–302j each include two storage node contacts and one bit line contact. Word lines (306a–306d) are formed over the active areas (302a–302j). Unlike the folded bit line arrangement of FIG. 2, in the open bit line arrangement, each word line overlaps an active area in each column.

Figure 3:
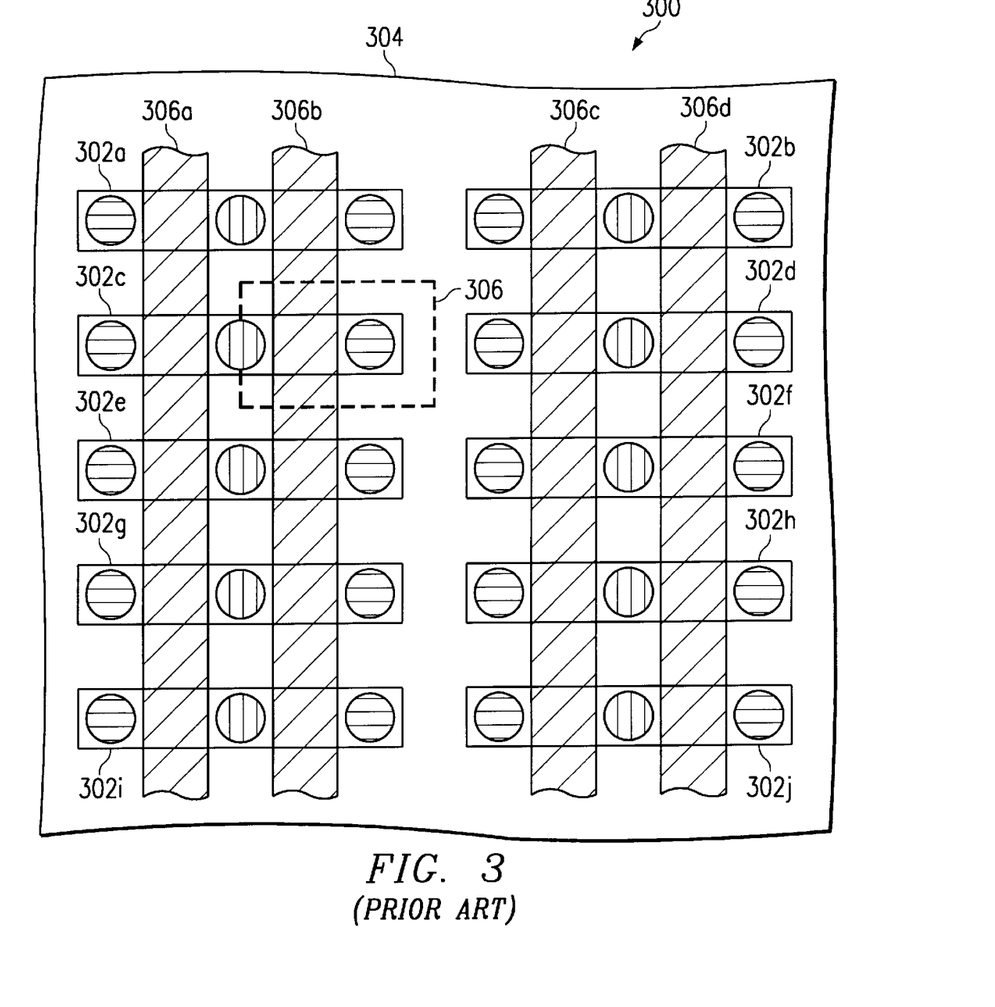
FIG. 3 is top plan view of a prior art open bit line ferroelectric memory device array.

In the open bit line case of FIG. 3, the area of one memory cell is shown by a cell area 306. If a minimum feature size is given as F, the area consumed by a memory cell in an open bit line arrangement is shown to be $6F^2$. Thus, while an open bit line arrangement provides for smaller memory cell areas, it is recalled that such arrangements are susceptible to noise.

It would be desirable to find some way of reducing the physical size of a ferroelectric memory device array, without incurring the drawbacks of the prior art.

SUMMARY OF THE INVENTION

According to the preferred embodiment, a ferroelectric random access memory (FeRAM) includes a number of memory cells arranged into rows and columns. Each memory cell includes an access transistor and a ferroelectric capacitor. Unlike prior art array approaches, the preferred embodiment includes first type memory cells, having access transistors of a first conductivity type, and second type memory cells, having access transistors of a second conductivity type.

A compact folded bit line FeRAM architecture is achieved by including alternating pairs of first type memory cells and second type memory, each pair being coupled to a particular bit line pair. The alternating types of memory cells are further connected to a common word line. When the word line is at a first voltage, the access transistor of the first type memory cell is turned on, coupling the ferroelectric capacitor therein to a first bit line of the bit line pair. The access transistor of the second type memory cell is turned off, allowing the second bit line of the bit line pair to serve as a reference line. When the word line is at a second voltage, the access transistor of the second memory cell is turned on, coupling the ferroelectric capacitor therein to the second bit line of the bit line pair. The access transistor of the first type memory cell is turned off, allowing the first bit line to serve as a reference line.

According to one aspect of the preferred embodiment, the FeRAM array is formed by a number of first active areas formed in a semiconductor substrate of a first conductivity type, and a number of second active areas, each adjacent to a first active area, formed in a substrate of a second conductivity type.

According to another aspect of the preferred embodiment, the FeRAM array includes column pairs of first type memory cells that alternate with column pairs of second type memory cells.

DETAILED DESCRIPTION OF THE EMBODIMENTS

The preferred embodiment is a ferroelectric random access memory (FeRAM) having a folded bit line architecture, but with a more compact arrangement than the prior art. Given a minimum feature size of F, array layouts having memory cell areas equal to $6F^2$ are possible. The preferred embodiment achieves a more compact array by utilizing pass transistors of different conductivity types in adjacent columns within the array. As a result, the preferred embodiment includes word lines that are coupled to pairs of pass transistors having complementary conductivity. With such an arrangement, when a word line is at a first potential, one of the pass transistors will be turned on, coupling it ferroelectric capacitor to a first bit line. The other transistor will be turned off, isolating its ferroelectric capacitor from a second bit line, and enabling the second bit line to be charged to a reference voltage.

Figure 4:
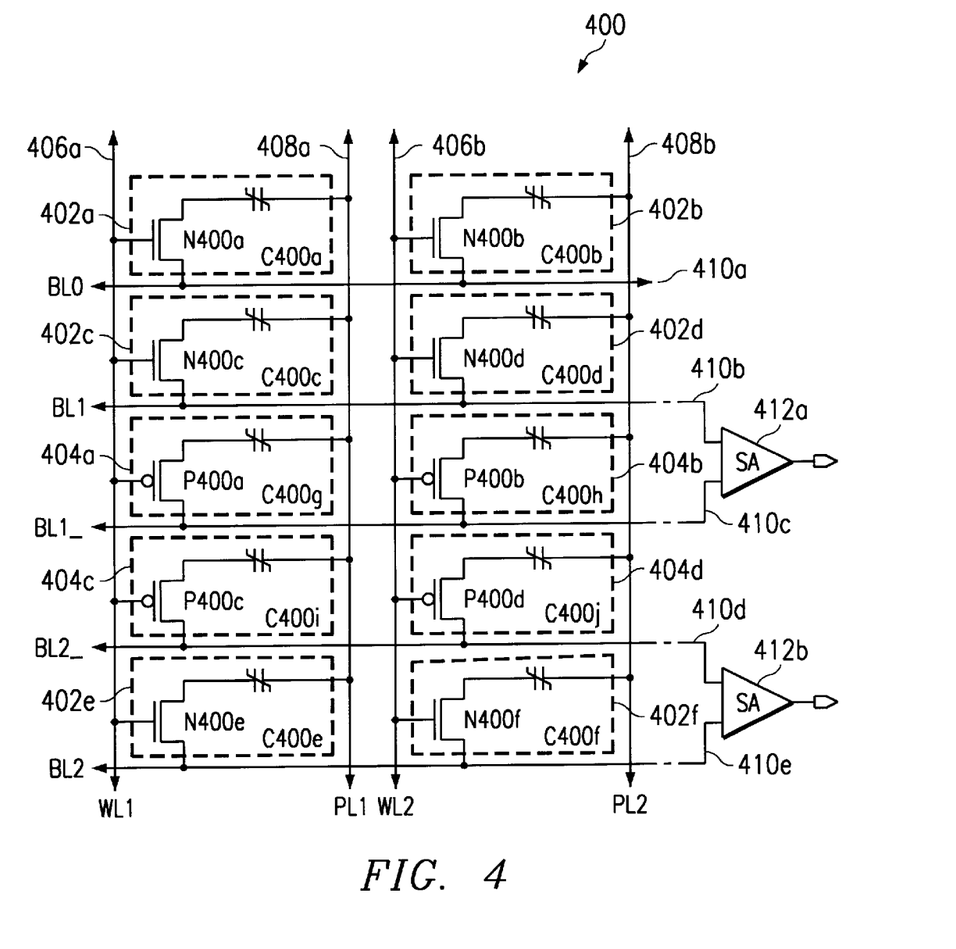
FIG. 4 is schematic diagram of the preferred embodiment.

The preferred embodiment is set forth in a schematic diagram in FIG. 4, and designated by the general reference character 400. The preferred embodiment 400 includes first type memory cells 402a–402f, and second type memory cells 404a–404d. The first and second type memory cells differ from one another in that the first type memory cells 402a–402f are activated (i.e., provide access for reading or writing data) by a first particular voltage, while the second type memory cells 404a–404d are activated by a second particular voltage.

In the preferred embodiment 400 each first type memory cell 402a–402f includes an n-channel access transistor (N400a–N400f) and a ferroelectric capacitor (C400a–C400f). In contrast, each second type memory cell 404a–404d includes a p-channel access transistor (P400a–P400d) and a ferroelectric capacitor (C400g–C400j). Thus, a high word line voltage will activate the first type memory cells (402a–402f) by turning on the n-channel transistor therein, and a low word line voltage will activate the second type memory cells (404a–404d) by turning on the p-channel transistor therein.

The memory cells of the preferred embodiment can be conceptualized as being arranged into complementary column pairs. A first type column of each complementary pair includes first type memory cells, while a second type column includes second type memory cells. For example, in FIG. 4, first type memory cells 402c and 402d can be considered to be in a first type column of a complementary pair, and second type memory cells 404a and 404b can be considered to be in a second type column of the same complementary pair. In the preferred embodiment, the arrangement of complementary column pairs results in two first type columns alternating with two second type columns, along the word line direction.

In the preferred embodiment, the memory cells (402a–402f and 404a–404d) are further arranged into rows of alternating first type memory cell pairs and second type memory cell pairs. The memory cells of the same row are commonly coupled to a word line.

The schematic diagram of FIG. 4 includes two rows extending on the vertical direction of the figure. Memory cells 402a, 402c, 402e, 404a and 404c are in one row, and coupled to word line 406a (WL1). Memory cells 402b, 402d, 402f, 404b and 404d are in the other row, and coupled to word line 406b (WL2). The word lines are coupled to the memory cells of their respective rows by the gates of the pass transistors. In addition to being coupled to a word line, each row of memory cells is further coupled to a common plate line. In FIG. 4 memory cells 402a, 402c, 402e, 404a and 404c are commonly coupled to plate line 408a (PL1) and memory cells 402b, 402d, 402f, 404b and 404d are commonly coupled to plate line 408b. Each plate line is coupled to the memory cells of its respective row by one plate of the ferroelectric capacitor within the memory cell.

Corresponding to each column of memory cells is a bit line. The bit lines of each complementary column pair form a bit line pair. Thus, in the preferred embodiment of FIG. 4, a bit line 410b (BL1) coupled to first type memory cells 402c and 402d forms a first bit line of a bit line pair. Bit line 410c (BL1__) is coupled to second type memory cells 404a and 404b, forming the second bit line of a bit line pair. A second bit line pair (BL2__ and BL2) which includes bit lines 410d and 410e, is coupled to a second complementary column pair. Each bit line pair provides two inputs to a sense amplifier. In FIG. 4, two sense amplifiers (SA) are set forth as items 412a and 412b. Sense amplifier 412a is coupled to bit line pair 410b/410c, and sense amplifier 412b is coupled to bit line pair 410d/410e.

Figure 5A:
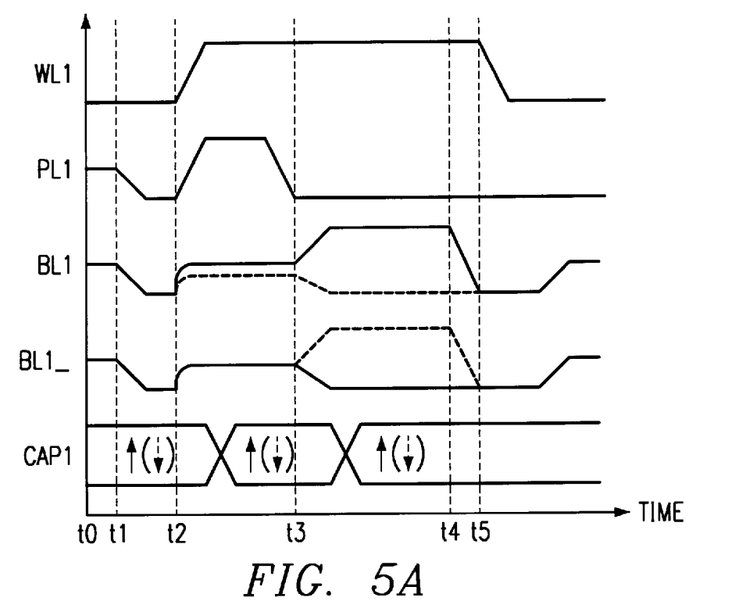
FIGS. 5A and 5B are timing diagrams illustrating read operations of the preferred embodiment.
Figure 5B:
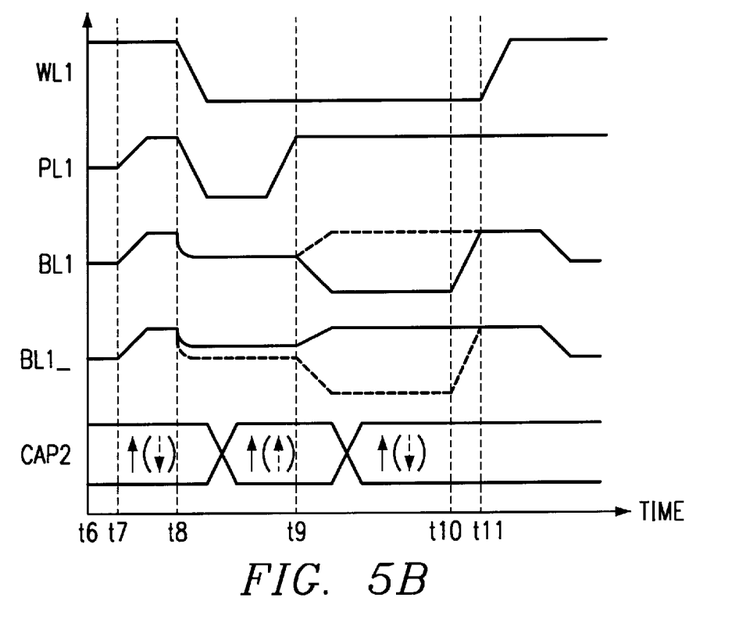
Figure 6A:
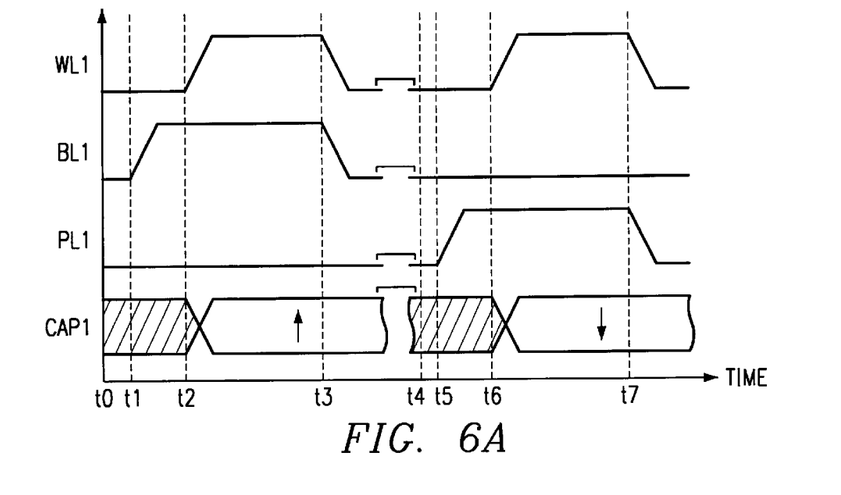
FIGS. 6A and 6B are timing diagrams illustrating write operations of the preferred embodiment.
Figure 6B:
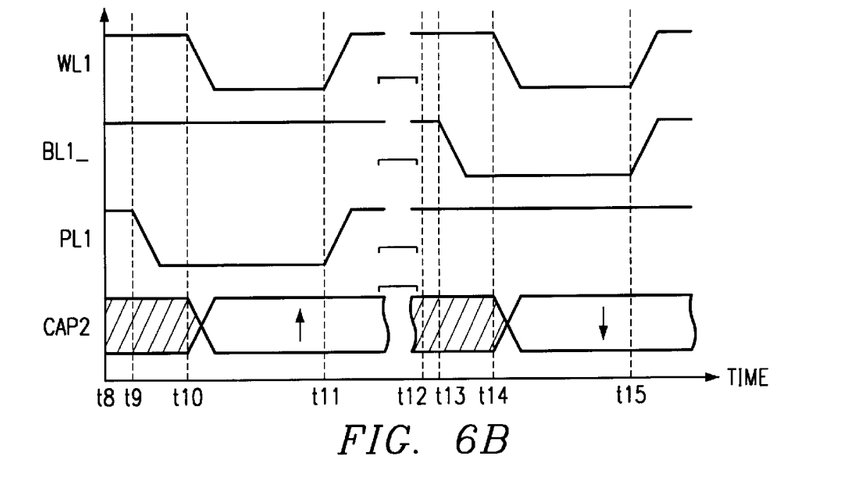

The operation of the preferred embodiment is best understood with reference to FIGS. 5A–5B and 6A–6B. FIGS. 5A–5B illustrate a manner by which data can be read from the memory cells of the preferred embodiment. FIGS. 6A–6B illustrate a manner by which data can be written into the memory cells of the preferred embodiment.

Referring now to FIG. 5A in conjunction with FIG. 4, a read operation from a first type of memory cell 402c is set forth in a timing diagram. It is understood that the response of memory cell 402c can represent the response of any of the first type memory cells of the array. The timing diagram illustrates the response of word line 406a WL1, plate line 408a PL1, and bit line pairs 410b and 410c (BL1/BL1__). In addition, the polarization state of the ferroelectric capacitor of the memory cell is shown in a diagrammatic representation as waveform CAP1.

At time t0, the WL1 waveform is low, indicating a low voltage is applied to the gate of access transistor N400c within first type memory cell 402c. The access transistor N400c is thus turned off, and the ferroelectric capacitor C400c is isolated from the bit line 410b. The BL1 and BL1__ waveforms are at an intermediate precharge voltage, midway between a high voltage (VDD) and a low voltage (VSS). Two possible initial capacitor polarization states are shown. A first state, representing a logic zero, is shown by an upward pointing arrow in the CAP1 waveform. The second state, representing a logic one, is shown by a downward pointing arrow surrounded by parentheses.

Figure 7A:
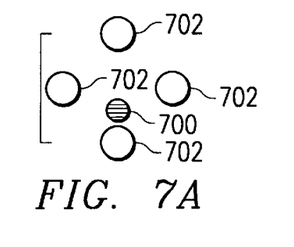
FIGS. 7A and 7B are views of a ferroelectric material illustrating two possible polarization states.
Figure 7B:
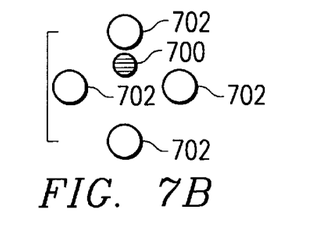

If reference is made to FIGS. 7A and 7B, the two polarization states are generally described by a lattice diagram of a ferroelectric material. In FIG. 7A, showing a first polarization state, a polarizing ion 700 (Pb3+ as just one example) in the ferroelectric material has moved to a first position with respect to other elements 702 in the material (Sr2– as just one example). In FIG. 7B, a second polarization state, the polarizing ion 700 has moved to a second position with respect to other elements 702 in the material.

Given the two possible initial polarization states of ferroelectric capacitor C400c, FIG. 5A represents two possible responses of the first type memory cell 402c during a read operation. A first response assumes that the storage capacitor C400c is initially in the first polarization state, and is represented by solid line waveforms and arrows. The second response assumes that the storage capacitor is in the second polarization state, and is represented by dashed waveforms, and a dashed arrow surrounded by parentheses.

At time t1, the WL1 signal remains low, maintaining transistor N400c in an off state. At about the same time, the PL1, BL1 and BL1__ signals all transition low. The ferroelectric capacitor C400c retains its initial polarization state.

At time t2, the word line 406a and plate line 408a is driven high, shown by the high-going WL1 and PL1 transitions. Transistor N400c within memory cell 402c is turned on, coupling the ferroelectric capacitor C400c to bit line 410b (BL1). If the ferroelectric capacitor C400c was in the first polarization state, the bit line 410b will rise to a first level as shown by the solid line. If the ferroelectric capacitor was in the second polarization state, the bit line 410b will rise to the second level, shown by the dashed line. Because word line WL1 is driven high, transistor P400a, within second type memory cell 404a, remains turned off, enabling bit line 410c to function as a reference line. In the preferred embodiment, reference circuits can place the bit line 410c at a reference potential intermediate to the two possible responses of bit line 410b. Thus, if the storage capacitor C400a was initially in the first polarized state, BL1 would be higher than BL1__. If, however, the storage capacitor was initially in the second polarized state, BL1 would be lower than BL1__.

It is noted that the electric field created by the application of the plate pulse (the high PL1 transition) can be destructive to the polarization state of the ferroelectric capacitor C400c. Accordingly, although the ferroelectric capacitor C400c may begin the read operation in the first polarization state, the application of the plate line pulse results in a field which can polarize the ferroelectric capacitor to the second state.

At time t3, the plate pulse terminates as the PL1 signal returns low. Shortly afterward, sense amplifier 412a (along with the other sense amplifiers) is activated, amplifying the differential voltage on the bit line pair 410b/410c (BL1/BL1_). In this manner, the initial polarization state of ferroelectric capacitor C400c results in full, complementary logic values on bit lines 410b/410c. It is noted that activation of the sense amplifiers also serves to rewrite the initial polarization state back into the storage capacitor, in the event the plate pulse has resulted in a destructive read operation. Thus, as shown in FIG. 5A, in the event the ferroelectric capacitor C400c was initially in the first polarization state, while the plate pulse will place it in the second polarization state, the sense amplifier activation will create an electric field across the ferroelectric capacitor C400c that returns capacitor C400c to the first polarization state.

At time t4, after the data has been read, and the ferroelectric capacitor C400c polarized back to its initial state (if necessary), the bit line pair 410b/410c returns low.

At time t5, the read operation terminates with the WL1 signal returning low once more. Shortly afterward, the bit pair 410b/410c returns to the intermediate precharge potential.

Referring now to FIG. 5B in conjunction with FIG. 4, a read operation from a second type of memory cell 404a is set forth in a timing diagram. It is understood that the response of memory cell 404a can represent the response of any of the second type of memory cells in the array. The timing diagram identifies the same waveforms as FIG. 5A, including the response of word line 406a WL1, plate line 408a PL1, and bit line pairs 410b and 410c (BL1/BL1_). In addition, the polarization state of ferroelectric capacitor C400g (the ferroelectric capacitor of memory cell 404a) is shown as CAP2.

At time t6, the WL1 waveform is high, indicating a high voltage is applied to the gate of access transistor P400a within second type memory cell 404a. The access transistor P400a is thus turned off and the ferroelectric capacitor C400g is isolated from the bit line 410c. The BL1, BL1_, and PL1 waveforms indicate that bit lines 410b, 410c and plate line 408a are all at the intermediate precharge voltage. It is noted that, at time t6, a high voltage is applied via word line 406a to the gates of n-channel transistors within the first type memory cells. However, because both the bit lines and plate lines are at the precharge voltage, the electric field across the ferroelectric capacitors within the first type memory cells does not reach a coercive magnitude (an electric field of sufficient magnitude to affect the polarization state of the ferroelectric capacitors within the first type memory cells).

As in the case of FIG. 5A, in FIG. 5B two possible initial capacitor polarization states are indicated for ferroelectric capacitor C400g. The first state is represented by a solid upward pointing arrow. The second state is represented by a dashed downward pointing arrow surrounded by parentheses. Along these same lines, the waveforms of bit lines 410b (BL1) and 410c (BL1_) provide two responses each, a solid waveform, showing the bit line response to an initial first polarization state, and a dashed waveform, showing the bit line response to an initial second polarization state.

At time t7, the WL1 signal is high, keeping transistor P400c in an off state. At about the same time, the PL1, BL1 and BL1_ signals transition high together. This simultaneous rise in potential also results in the electric field across the ferroelectric capacitors within the first type memory cells being maintained at zero or near zero magnitude, preventing changes to the polarization states of the ferroelectric capacitors.

At time t8, the word line 406a and plate line 408a are both driven low, shown by the WL1 and PL1 transitions. Transistor P400a within memory cell 404a is turned on, coupling the ferroelectric capacitor C400g to bit line 410c (BL1_). If the ferroelectric capacitor C400g was in the first polarization state, the bit line 410c will fall to a first level, as shown by the solid line. If the ferroelectric capacitor C400g was in the second polarization state, the bit line 410c will fall to a second, lower level, shown by the dashed line. Because word line WL1 is driven low, transistor N400c within first type memory cell 402c is turned off, enabling bit line 410b to function as a reference line. In the preferred embodiment, reference circuits can place the bit line 410b at a potential intermediate to the two possible responses of bit line 410c. Thus, if the storage capacitor C400g was initially in the first polarized state, BL1_ would be higher than BL1. If, however, the storage capacitor was initially in the second polarized state, BL1_ would be lower than BL1.

As was the case in the read operation shown in FIG. 5A, the reading of data from a second type memory cell can be destructive to the polarization state of the ferroelectric capacitor. As shown in FIG. 5B, if the ferroelectric capacitor C400g was initially in the second polarized state, the read operation, due to the magnitude of the field created by the low plate voltage and high (but floating) potential of bit line 410c (BL1_), the ferroelectric capacitor C400g will be polarized to the second state after time t8.

At time t9, the plate pulse terminates and the PL1 signal returns high. Shortly afterward, sense amplifier 412a is activated, amplifying the differential voltage appearing across the bit line pair 410b/410c (BL1/BL1_). In this manner, the initial polarization state of ferroelectric capacitor C400g results in full, complementary logic values on bit lines 410b/410c. Like the read operation of FIG. 5, the activation of the sense amplifier can also serve to rewrite the initial polarization state back into the storage capacitor, in the event the low-going plate pulse has been destructive. Thus, as shown in FIG. 5B, following time t9, in the event the ferroelectric capacitor C400g was initially in the second polarization state, the operation of the sense amplifier 412a will return the ferroelectric capacitor to the same second polarization state.

The read operation of the second type memory cells concludes in a similar fashion to that of the first type memory cells. At time t10, the bit line pair 410b/410c returns high. Afterward, at time t11, the read operation terminates with the WL1 signal returning high. The bit pair 410b/410c will then return to the intermediate precharge potential.

Having described a manner for reading data from the preferred embodiment. a manner for writing data into the preferred embodiment will now be described. Write operations are set forth in timing diagrams in FIGS. 6A and 6B. FIG. 6A illustrates a write operation to a first type memory cell, and shows the writing of a first logic value and a second logic value. In a similar manner, FIG. 6B illustrates the writing of two values to a second type memory cell.

Referring now to FIG. 6A in conjunction with FIG. 4, the writing of different logic values to first type memory cell 402c is illustrated. It is understood that the write operation set forth may be performed on any of the other first type memory cells in the preferred embodiment. FIG. 6A illustrates the response of word line 406a (WL1), bit line 410b (BL1), and plate line 408a (PL1). In addition, the polarization state of storage capacitor C400c is illustrated by waveform CAP1. The writing of a first logic value, that results in the ferroelectric capacitor C400c being placed in the first polarization state is shown between times t0 and t3. The writing of a second logic value, that results in the ferroelectric capacitor C400c being placed in the second polarization state is shown between times t4 and t7. Polarization states are indicated by arrows. An upward arrow represents the first polarization state, and a downward arrow represents a second polarization state.

At time t0, word line 406a is low, turning off transistor N400c, and isolating bit line 410b from ferroelectric capacitor C400c. Bit line 410b (BL1) and the plate line 408a (PL1) are also low. Because data will be written into ferroelectric capacitor C400c, the polarization state CAP1 is shown in a "don't" care state (hatched). It is noted that while the low word line voltage will turn on the p-channel access transistors within the second type memory cells, the electric field across the ferroelectric capacitor does not reach a coercive magnitude.

At time t1, the WL1 remains low, and ferroelectric capacitor C400c remains isolated from bit line 410b. However, bit line 410b is driven high at time t3 to place a first positive potential on the bit line. The plate line 408a remains low. In this manner, the conditions for applying a first coercive electric field (a field that forces the ferroelectric capacitor into the first polarization state) are established by the high bit line voltage and relatively low plate voltage. The CAP1 state is shown to continue to be in the don't care state.

At time t2, the word line 406a is driven high, turning on transistor N400c within first type memory cell 402c. Once transistor N400c is turned on, the high voltage on bit line 410b is applied to one plate of ferroelectric capacitor C400c. At the same time, the low voltage of the plate line 408a is applied to the opposing plate of the ferroelectric capacitor C400c. The voltages at the plates of capacitor C400c results in a coercive electric field which polarizes the capacitor into the first state.

At time t3, the word line 406a and bit line 410b return to the low voltage level, and ferroelectric capacitor C400c is isolated once again from bit line 410b. Due to the inelastic nature of the ferroelectric dielectric, the ferroelectric capacitor C400c remains in the first polarization state.

The writing of a second logic value, shown between times t4 and t7, proceeds in a similar fashion to the writing of the first logic value. At time t4, word line 406a, bit line 410b, and plate line 408a are precharged low.

At time t5, the potentials are established for creating a second coercive field (the field necessary to polarize the ferroelectric capacitor C400c to the second state). Unlike the write operation shown between times to and t3, the relative potentials of bit line 410b and plate 408a are essentially reversed, with the bit line 410b remaining low, while plate line 408a is driven high.

At time t6, the coercive field is applied to ferroelectric capacitor C400c, by word line 406a being driven high. The relatively low bit line 410b potential and relatively high plate line 408a potential create a field across the ferroelectric capacitor C400c that polarizes the capacitor to the second state.

At time t7, the word line 406a and plate line 408a both return to low logic levels, turning off transistor N400c. Ferroelectric capacitor C400c remains in the second polarization state.

Referring now to FIG. 6B in conjunction with FIG. 4, the writing of logic values to second memory cell 404a will be described. It is understood that the write operation set forth may be performed on any of the other second memory cells in the preferred embodiment. FIG. 6B includes some of the signals illustrated in FIG. 6A, including the word line 406a (WL1), the bit line 410b (BL1), and plate line 408a (PL1). In addition, the polarization state of storage capacitor C400g are illustrated by waveform CAP2.

At time t8, word line 406a is high, turning off transistor P400a, and isolating the ferroelectric capacitor C400g from bit line 410c. Bit line 410c (BL1_) and the plate line 408a (PL1) are also high. The polarization state of ferroelectric capacitor C400g does not matter at this time, and so is shown by hatching. While the transistors of first type memory cells may be turned on at this time, the resulting electric field across the ferroelectric capacitors is not sufficient to adversely affect the polarization state of these capacitors.

At time t9, word line WL1 is still high, keeping ferroelectric capacitor C400g isolated from bit line 410c. Bit line 410c is driven high, and the plate line 408a is driven low, setting up the voltage necessary for a coercive electric field.

At time t10, word line 406a is driven low, turning on transistor P400a within second type memory cell 404a. The coercive electric field established by the high voltage on bit line 410c and the relatively low voltage of the plate line 408a, polarizes the ferroelectric capacitor C400g to the first state.

At time t11, the word line 406a and bit line 410c return to the high voltage level, and ferroelectric capacitor C400g is isolated once again from bit line 410c. Ferroelectric capacitor C400g remains in the established first polarization state.

The writing of the second logic value begins at time t12, with the word line 406a, bit line 410c, and plate line 408a being high. At time t13, write voltages, opposite to those occurring between times t8 and t11, are provided to the bit line 410c and the plate line 408a. Thus, at time t13, the bit line 410c is low and the plate line 408a is high. At time t14, a coercive voltage for establishing the second polarization state is applied. The word line 410c goes low, turning on transistor P400a. With bit line 410c low and the plate line 408a high, the resulting electric field causes ferroelectric capacitor C400g to be placed in the second polarization state. The write to the second type memory cell concludes at time t15, with the word line 406a and bit line 410c returning to a high power supply voltage.

In addition to providing the noise advantages of a folded bit line architecture, the preferred embodiment also provides for a compact memory cell array arrangement. Given a minimum feature size F, layouts having first and second memory cell areas of $6F^2$ are possible. To illustrate the advantageous layout possibilities of the preferred embodiment, a top plan view illustrating a FeRAM array is set forth in FIG. 8.

The FeRAM array is designated by the general reference character 800 and shown to be formed on a semiconductor substrate 802. The vertical direction in FIG. 8 can be considered a row direction, and the horizontal direction in FIG. 8 can be considered a column direction. In the preferred embodiment, the substrate 800 is p-doped monocrystalline silicon. Unlike the prior art array arrangement which utilizes only n-channel pass transistors, the preferred embodiment includes both p-channel and n-channel devices within the array. Accordingly, the FeRAM array 800 is shown to further include an n-type well 804 formed within the p-type substrate 802.

While the preferred embodiment utilizes an n-well complementary metal-oxide-semiconductor (CMOS) structure, other CMOS structures could be employed. For example, FeRAM arrays according to the teaching of the preferred embodiment could be made with p-well structures, or "twin-tub" structures. It is also noted that the n-well 804 would extend in the column direction along the length of the array.

Figure 8:
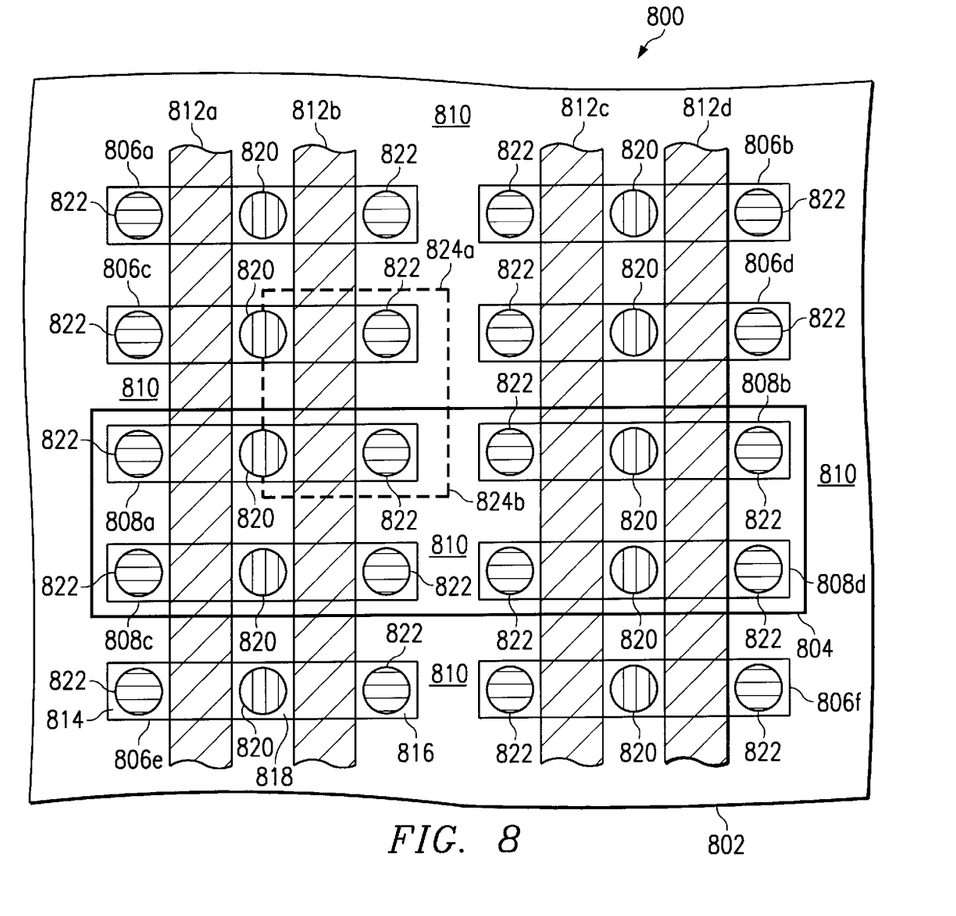
FIG. 8 is a top plan view of the preferred embodiment set forth in FIG. 4.

A number of first active areas 806a–806f and second active areas 808a–808d are formed in the semiconductor substrate 800, isolated from one another by isolation structures 810. The first active areas 806a–806f are formed in the p-type portions of the substrate. The second active areas 808a–808d are formed within the n-type well 804. The first and second active areas (806a–806f and 808a–808d) can be considered to be aligned with one another in the column direction, so as to form first type columns and second type columns. For example, first active areas 806c and 806d are in a first type column, while second active areas 808a and 808b are in an adjacent second type column. When viewed in this manner, the preferred embodiment FeRAM array 800 is shown to include alternating pairs of first type columns and second type columns.

In the preferred embodiment FeRAM array, in order to reduce the area required between active areas, shallow trench isolation (STI) is the preferred isolation structure 810.

The arrangement of the FeRAM array 800 can also be considered in the row direction. The active areas can be considered to be arranged as adjacent complementary pairs in the row direction. For example, a row in FIG. 8 can include complementary active areas 806e and 808c, adjacent to complementary active areas 808a and 806c. At the same time, the particular arrangement of the preferred embodiment can also be considered to be arranged in like pairs in the row direction (e.g., 808c/808a and 806c/806a).

The preferred embodiment also includes a number of word lines for forming, and commonly connecting, the gates of access transistors within each row of the array. The word lines are shown in FIG. 8 as items 812a–812d. Two word lines overlap each row of active areas, regardless of whether the active areas are in the p-type substrate 802 or the n-type well 804. Thus, as shown in the figure, word lines 812a and 812b overlap first active areas 806a, 806c and 806e, and second active areas 808a and 808c. Word lines 812c and 812d overlap first active areas 806b, 806d and 806f and second active areas 808b and 808d.

The word lines form two access transistors within their respective active areas. Right and left portions of each active area form drain regions, while central portions form a source common to both transistors. As an example, the left portion of first active area 806e is shown as item 814, and will function as the drain of a first n-channel access transistor. Word line 812a serves as the gate of the first transistor. A central portion 818 of first active area 806e, shown as item 816, functions as the source of the first transistor. In a mirror image fashion, a right portion of active area 806e serves as the drain of a second transistor, with word line 812b serving as the gate of the second transistor. The central portion 818 functions once again as a source region for the second transistor. It is understood that the transistors formed within the second active areas 808a–808d (formed within the n-well) are p-channel transistors. Accordingly, the central portions of the second active areas are common drains, while the left and right portions are sources.

A bit line (not shown) is coupled to the central portion of each active area in a given column. Thus, a first bit line would be coupled to the central portions of first active areas 806c and 806d, while an adjacent second bit line would be coupled to the central portions of second active areas 808a and 808b. In order to provide a conductive connection between each active area and its associated bit line, a bit line contact 820 is shown formed in the central portion of each active area. It is understood that the bit line contacts 820 are formed by etching a contact hole through an overlying insulation layer. The contact hole can then be filled with a conductive material to form "vias." Bit lines are then formed over the vias, making electrical contact with the vias. Alternatively, the conductive layer used to form the bit lines can be deposited after the contact holes are formed, resulting in the bit lines making direct contact to the central portions of their respective active areas.

Ferroelectric capacitors (not shown in FIG. 8) are coupled to each of the transistors formed within the array. To accomplish this connection, a number of capacitor contacts 822 are created. Like the bit line contacts, the capacitor contacts 822 are formed by etching through an overlying insulation layer. In the case of "capacitor-over-bit line" (COB) type ferroelectric capacitors, the etch step that forms the capacitor contacts would be performed after the bit lines have been formed, and an insulation layer is deposited over the bit lines. A COB type arrangement would result in the first plate of the ferroelectric capacitors overlapping the word lines in the array, and thus can provide greater capacitor area. In the case of a "capacitor-under bit line" (CUB) arrangement (also referred to as bit line-over-capacitor (BOC)), the capacitor contacts would be formed prior to the bit line contacts 820. A ferroelectric capacitor would then be formed coupled to each capacitor contact 820.

The areas occupied by a first type memory cell is shown in FIG. 8 by the first area indication 824a. Given a minimum feature of F (the width of a word line, for example) the first type memory cell is shown to occupy an area equal to $6F^2$. Thus, the preferred embodiment provides a more compact folded bit line array arrangement by providing $6F^2$ size memory cells instead of the $8F^2$ size memory cells of prior art folded bit line architectures. The spacing is even further reduced by advantageously small second type memory cells. Also set forth in FIG. 8 is a second area indication 824b defining the extents of a second type memory cell. The area of the second type memory cell is shown to also occupy an area of equal to $6F^2$. In this manner, area reductions in a folded bit line FeRAM array are accomplished above and beyond those achievable by simple reductions in feature size (i.e., "shrinks").

Figure 9:
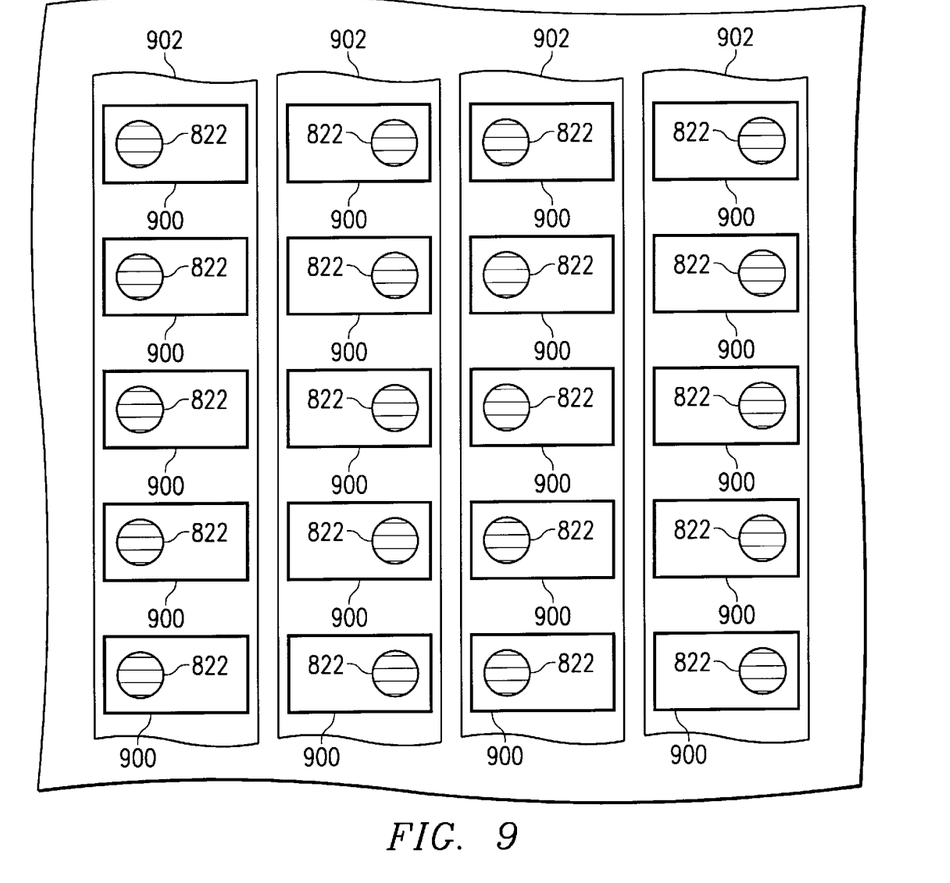
FIG. 9 is a top plan view of the preferred embodiment set forth in FIG. 8, illustrating the ferroelectric capacitor arrangement of the preferred embodiment.

To better understand the arrangement of the ferroelectric capacitors within the preferred embodiment FeRAM array 800, FIG. 9 is provided to illustrate the plate arrangement of the capacitors. FIG. 9 sets forth the same general view as FIG. 8, and includes the capacitor contacts 822. The ferroelectric capacitors are each formed by bottom plates 900, each coupled to an access transistor by one of the capacitor contacts 822. A ferroelectric material is then formed on the bottom plates. Plate lines 902 are then formed over the bottom plates in a row-wise fashion. The ferroelectric capacitors of the preferred embodiment (as defined by the bottom plates 900 in FIG. 9) can be conceptualized as being arranged in rows, with the ferroelectric capacitors of the same row sharing a common plate line 902 that serves as a top capacitor plate.

It is understood that while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. A ferroelectric memory device, comprising:
   a semiconductor substrate having a plurality of first substrate portions of a first conductivity type and a plurality of second substrate portions of a second conductivity type;
   a plurality of first memory cells formed in each first substrate portion and arranged into at least one column of first memory cells, each first memory cell including an access transistor of one conductivity type coupled to a ferroelectric capacitor;
   a plurality of second memory cells formed in each second substrate portion and arranged into at least one column of second memory cells, each second memory cell including an access transistor of another conductivity type, coupled to a ferroelectric capacitor; and
   the first memory cells and second memory cells form rows of memory cells that include first memory cells adjacent to second memory cells, the first and second memory cells of like rows being commonly coupled to a word line.

2. The ferroelectric memory device of claim 1, wherein: the first substrate portions include p-doped monocrystalline silicon.

3. The ferroelectric memory device of claim 2, wherein: the second substrate portions include n-type wells formed within the first substrate portions.

4. The ferroelectric memory device of claim 1, wherein: the access transistor of each first memory cell is an insulated gate field effect transistor (IGFET).

5. The ferroelectric memory device of claim 4, wherein:
   the first substrate portions include p-doped monocrystalline silicon; and
   the access transistor of each first memory cell is an n-channel IGFET.

6. The ferroelectric memory device of claim 1, wherein: the access transistor of each second memory cell is an insulated gate field effect transistor (IGFET).

7. The ferroelectric memory device of claim 6, wherein:
   the second substrate portions include n-doped monocrystalline silicon; and
   the access transistor of each second memory cell is a p-channel IGFET.

8. The ferroelectric memory device of claim 1, wherein:
   the first memory cells of each first substrate portion are arranged into two columns of first memory cells; and
   the second memory cells of each second substrate portion are arranged into two columns of second memory cells.

9. The ferroelectric memory device of claim 8, wherein: each column of first memory cells is disposed adjacent to a column of second memory cells, each adjacent column of first memory cells and second memory cells forming a complementary column pair.

10. The ferroelectric memory device of claim 9, further including:
    a bit line pair associated with each complementary column pair, each bit line pair including a first bit line and second bit line, the first bit line being coupled to the column of first memory cells of the complementary pair, the second bit line being coupled to the column of second memory cells of the complementary pair.

11. The ferroelectric memory device of claim 10, further including:
    a sense amplifier coupled to each bit line pair.

12. A semiconductor memory device, comprising:
    a plurality of first active areas aligned with one another in a first direction to form a plurality of first columns;
    a plurality of second active areas aligned with one another in the first direction to form a plurality of second columns, each second column being situated adjacent to a first column;
    a plurality of word lines disposed in a second direction, generally perpendicular to the first direction, each word line overlapping adjacent first active areas and second active areas;
    a plurality of ferroelectric capacitors, each having a first plate and a second plate, at least one ferroelectric capacitor being associated with each first active area and each second active area, and coupled thereto by its respective first plate;
    a first bit line coupled to each first column; and
    a second bit line coupled to each second column.

13. The semiconductor memory device of claim 12, wherein:
    the first active areas are formed in a substrate of a first conductivity type; and
    the second active areas are formed in a substrate of a second conductivity type.

14. The semiconductor memory device of claim 12, wherein:
    the first active areas are separated from one another by isolation structures.

15. The semiconductor memory device of claim 14, wherein:
    the isolation structures are formed by shallow trench isolation techniques.

16. The semiconductor memory device of claim 12, wherein:
    the word lines overlapping each first active area form access transistors for first-type memory cells, and the word lines overlapping each second active area form access transistors for second-type memory cells; and
    the ferroelectric capacitors form data storage devices for each first-type memory cell and each second-type memory cell.

17. The semiconductor memory device of claim 16, wherein:
    the word lines have a width equivalent to a value F, and each first-type memory cell has an area equivalent to $6F^2$.

18. The semiconductor memory device of claim 16, wherein:
    the word lines have a width equivalent to a value F, and each second-type memory cell has an area equivalent to $6F^2$.

19. The semiconductor memory device of claim 18, wherein:
    each first-type memory cell also has an area equivalent to $6F^2$.

20. The semiconductor memory device of claim 16, wherein:
    the first active areas have a width equivalent to a value F, and each first-type memory cell has an area equivalent to $6F^2$.

21. The semiconductor memory device of claim 16, wherein:

the second active areas have a width equivalent to a value F, and each second-type memory cell has an area equivalent to $6F^2$.

22. The semiconductor memory device of claim 21, wherein:

each first-type memory cell also has an area equivalent to $6F^2$.

23. The semiconductor memory device of claim 12, wherein:

two word lines overlap each first active area forming two first-type access transistor therein, the two first-type transistors of each first active area sharing a first-type common diffusion region; and two word lines overlap each second active area forming two second-type access transistor therein, the two second-type transistors of each second active area sharing a second-type common diffusion region.

24. The semiconductor memory device of claim 23, further including:

a plurality of bit line contacts including first bit line contacts formed to the first-type common diffusion region of each first active area, and second bit line contacts formed to the second-type common diffusion region of each second active area;

a first bit line is coupled to each first bit line contact; and a second bit line is coupled to each second bit line contact.

25. The semiconductor memory device of claim 12, wherein:

the first plate of each ferroelectric capacitor is formed over one of the word lines.

26. The semiconductor memory device of claim 12, wherein:

the ferroelectric capacitors are generally arranged into capacitor columns disposed in the first direction and capacitor rows disposed in the second direction, the second plates of each ferroelectric capacitor in the same capacitor row being commonly coupled together.

27. The semiconductor memory device of claim 26, wherein:

the second plates of ferroelectric capacitors in the same row are an integral structure.

28. In a ferroelectric semiconductor memory device, an array architecture comprising:

a plurality of complementary bit line pairs, each including a first bit line and a second bit line;

a plurality of sense amplifiers, one sense amplifier being coupled to each complementary bit line pair;

a plurality of word lines disposed generally perpendicular to the complementary bit line pairs;

a first-type memory cell generally situated at the intersection of each first bit line and one of the word lines, each first-type memory cell including a first-type access transistor of a first conductivity type and a ferroelectric device, each first-type access transistor providing a controllable impedance path between its associated first bit line and ferroelectric device; and a second-type memory cell generally situated at the intersection of each second bit line and one of the word lines, each second-type memory cell including a second-type access transistor of a second conductivity type and a ferroelectric device, each second-type access transistor providing a controllable impedance path between its associated second bit line and ferroelectric device.

29. The array architecture of claim 28, wherein:

the complementary bit lines are further arranged in the word line direction into alternating pairs of first bit lines and second bit lines.

30. The array architecture of claim 28, wherein:

each word line is coupled to consecutive complementary memory cell pairs, each complementary memory cell pair including one of the first-type memory cells adjacent to one of the second type memory cells, each consecutive complementary memory cell pair being further coupled to one of the complementary bit line pairs.

31. The array architecture of claim 28, wherein:

the first-type access transistor of each first-type memory cell is an insulated gate field effect transistor (IGFET) having a control gate coupled to a word line.

32. The array architecture of claim 31, wherein:

each first-type access transistor is an n-channel IGFET.

33. The array architecture of claim 31, wherein:

the control gate of each first-type access transistor is an integral portion of its respective word line.

34. The array architecture of claim 28, wherein:

the second-type access transistor of each second-type memory cell is an insulated gate field effect transistor (IGFET) having a control gate coupled to a word line.

35. The array architecture of claim 34, wherein:

each second-type access transistor is a p-channel IGFET.

36. The array architecture of claim 34, wherein:

the control gate of each second-type access transistor is an integral portion of its respective word line.

37. The array architecture of claim 28, wherein:

each ferroelectric device is a ferroelectric capacitor having a first plate separated from a second plate by a ferroelectric material.

38. The array architecture of claim 37, wherein:

each ferroelectric device of a first-type memory cell has a first plate coupled to the first-type access transistor of the memory cell.

39. The array architecture of claim 37, wherein:

each ferroelectric device of a second-type memory cell has a first plate coupled to the second-type access transistor of the memory cell.

40. The array architecture of claim 37, further including:

a plurality of plate lines disposed generally perpendicular to the complementary bit line pairs, each plate line being coupled to the second plate of ferroelectric devices in consecutive complementary memory cell pairs, each memory cell pair including one of the first-type memory cells and one of the second type memory cells.

41. The array architecture of claim 40, wherein:

the second plate of the ferroelectric device within each first-type access transistor is an integral portion of its respective plate line.

42. The array architecture of claim 40, wherein:

the second plate of the ferroelectric device within each second-type access transistor is an integral portion of its respective plate line.

43. In a ferroelectric semiconductor memory device, a method of accessing ferroelectric memory cells comprising the steps of:

providing first and second memory cells within a row, the first and second memory cells each including a ferroelectric device for storing data values, the first memory cells coupling their respective ferroelectric device to an associated first bit line by the application of a first voltage, and isolating their respective ferroelectric device from the associated first bit line by the application of a second voltage the second memory cells coupling their respective ferroelectric device to an associated second bit line by the application of the second voltage, and isolating their respective ferroelectric device from the associated first bit line by the application of the first voltage;

providing a word line coupled to each first and second memory cell within a row;

accessing first memory cells by applying the first voltage to the word line to couple the ferroelectric devices of first memory cells to the first bit lines, while isolating the second bit lines from the ferroelectric devices of the second memory cells; and accessing second memory cells by applying the second voltage to the word line to couple the ferroelectric devices of second memory cells to the second bit lines, while isolating the first bit lines from the ferroelectric devices of the first memory cells.

44. The method of claim 43, further including:

amplifying the voltage differential between adjacent first and second bit lines to read data values on the bit lines.

45. The method of claim 43, further including:

the ferroelectric devices are ferroelectric capacitors and the ferroelectric capacitors of the same row are further coupled to an associated common plate line; and in a read operation, applying a voltage pulse to one of the common plate lines.

46. The method of claim 43, wherein:

in a read operation the step of applying the first voltage to the word line further includes placing the second bit line at a first reference potential, and the step of applying the second voltage to the word line farther includes placing the first bit line at a second reference potential.

47. The method of claim 46, wherein:

the first reference potential is generally equivalent to the second reference potential.

48. The method of claim 43, further including:

in a write operation to a first memory cell, placing the associated first bit line at a first coercive potential prior to accessing the first memory cells; and in a write operation to a second memory cell, placing the associated second bit line at the first coercive potential prior to accessing the second memory cells.

49. The method of claim 48, further including:

the ferroelectric devices are ferroelectric capacitors and the ferroelectric capacitors of the same row are further coupled to an associated common plate line; and in a write operation to a first memory cell, placing the associated common plate at a second coercive potential prior to accessing the first memory cells; and in a write operation to a second memory cell, placing the associated common plate at the second coercive potential prior to accessing the second memory cells.

* * * * *